United States Patent [19]
Ohashi

[11] Patent Number: 6,031,759
[45] Date of Patent: Feb. 29, 2000

[54] NONVOLATILE SEMICONDUCTOR MEMORY DEVICE

[75] Inventor: Masaaki Ohashi, Ogaki, Japan

[73] Assignee: Sanyo Electric Co., Ltd., Osaka, Japan

[21] Appl. No.: 09/243,141

[22] Filed: Feb. 2, 1999

[30] Foreign Application Priority Data

Mar. 6, 1998 [JP] Japan .................................. 10-055261
Mar. 6, 1998 [JP] Japan .................................. 10-055262

[51] Int. Cl.[7] .............................. G11C 16/06; G11C 7/02
[52] U.S. Cl. ................................. 365/185.2; 365/185.11; 365/210
[58] Field of Search .......................... 365/185.03, 185.11, 365/185.2, 185.23, 210

[56] References Cited

U.S. PATENT DOCUMENTS

| | | | |
|---|---|---|---|
| 5,253,201 | 10/1993 | Atsumi et al. ........................ | 365/185.2 |
| 5,659,503 | 8/1997 | Sudo et al. ............................ | 365/185.2 |
| 5,768,184 | 6/1998 | Hayashi et al. ..................... | 365/185.03 |
| 5,818,759 | 10/1998 | Kobayashi ......................... | 365/185.15 |

*Primary Examiner*—Son Mai
*Attorney, Agent, or Firm*—Fish & Richardson P.C.

[57] ABSTRACT

A nonvolatile semiconductor memory device has a block of memory cells. The memory cells are arranged in rows and columns, forming a matrix. Each of the memory cells preferably includes a floating gate type transistor. A column of dummy cell transistors is located adjacent to the memory cell block. A selection circuit is connected to the memory cell block and the column of dummy cell transistors for selecting one of the memory cell transistors and one of the dummy cell transistors. A write circuit applies a first potential corresponding to write data to the selected memory cell and a second potential corresponding to the first potential inverted to the selected dummy cell transistor.

10 Claims, 7 Drawing Sheets

NONVOLATILE SEMICONDUCTOR MEMORY DEVICE

BACKGROUND OF THE INVENTION

The present invention relates to a nonvolatile semiconductor memory device that stores data using floating gate transistors. More specifically, the present invention pertains to a nonvolatile semiconductor memory capable of performing a stable data writing operation.

An electrically erasable programmable ROM (EEPROM) has a plurality of memory cells, with each memory cell including an electrically erasable transistor. Each memory cell transistor has, for example, a split gate type double gate structure including a floating gate and a control gate. In writing data to double gate structured memory cell transistor, hot electrons that have been produced in the drain region are accelerated and put into the floating gate. In reading data, a difference between an operation characteristic of the memory cell transistor when a charge is accumulated in the floating gate and that when a charge is not accumulated is detected.

Figure 1:
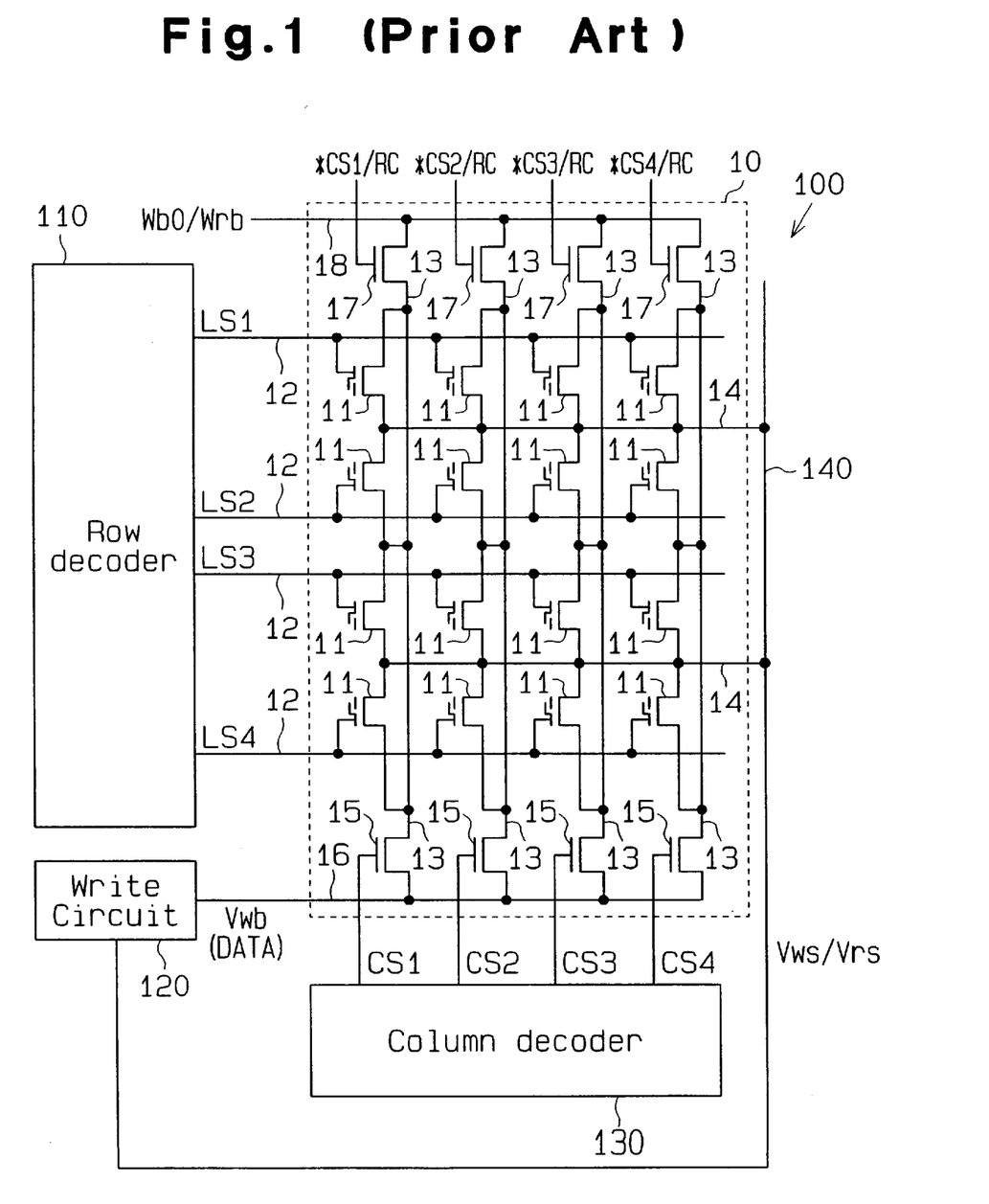
FIG. 1 is a schematic block diagram of a first conventional nonvolatile semiconductor memory device.

FIG. 1 is a schematic diagram of a nonvolatile semiconductor memory device 100 having a memory cell block 10, in which split gate type memory cell transistors 11 are arranged four rows by four columns.

Word lines 12 are arranged along the memory cell transistors 11 in each row and are commonly connected to the control gates of the memory cell transistors 11 in the same row. Row selection signals LS1 to LS4 are sent to the word lines 12 from a row decoder (row selection circuit) 110, and the memory cell transistors 11 in a selected row are activated in response to the signals LS1 to LS4.

Bit lines 13 are arranged along the memory cell transistors 11 in each column and are commonly connected to the drains of the memory cell transistors 11 in the same column. Source lines 14 are arranged between and in parallel with the word lines 12 and are commonly connected to the sources of the memory cell transistors 11 in the adjacent rows. Each source line 14 is connected to a common source line 140. A write potential Vws for writing data and a first read potential Vrs for reading data are selectively supplied to each memory cell transistor 11 through the common source line 140 and the source lines 14.

A plurality of first selection transistors 15 are respectively connected to each bit line 13 and selectively connect one of the bit lines 13 to a data line 16, in response to column selection signals CS1 to CS4 from a column decoder 130 applied to the gate of the selection transistor 15.

A write circuit 120 is connected to the data line 16 and supplies a potential Vmb corresponding to write data to one of the memory cell transistors 11. The data line 16 is also connected to a sense amplifier (not shown) and supplies a potential VBL to the sense amplifier when reading.

A plurality of second selection transistors 17 are respectively connected between each bit line 13 and a power supply line 18 and connect the non-selected bit lines 13 to the power supply line 18 in response to inverted signals *CS1 to *CS4 of column selection signals CS1 to CS4 applied to the gates thereof, when writing. A predetermined potential Vb0 for preventing a write current from flowing to each non-selected memory cell transistor 11 is supplied to each non-selected bit line 13 through the power supply line 18. The second selection transistors 17 connect the bit lines 13 to the power supply line 18 in response to a read control signal RC applied to the second selection transistor gate, when reading. A second read potential Vrb (>Vrs) is supplied to all of the bit lines 13 by way of the power supply line 18.

The row selection signals LS1 to LS4 are generated by the row decoder 110, based on row address information and select one of the word lines 12 (simultaneously activate each memory cell transistor 11 in the selected row). The column selection signals CS1 to CS4 are generated by a column decoder (column selection circuit) 130 based on column address information and selectively turn on one of the first selection transistors 15 (activate the memory cell transistors 11 in a specific column). One of the memory cell transistors 11 that was selected according to the row address information and the column address information is connected to the data line 16 through a bit line 13.

When writing data into a memory cell transistor 11, a potential Vmb corresponding to write data is applied to the data line 16, with one word line 12 selected, while applying a predetermined write potential Vws to the source lines 14. For example, a potential of 2V is applied to a selected word line 12, and a potential Vwb of 1V is applied to the data line 16 when the write data is '1', and a potential Vwb of 5V is applied to the data line 16 when the write data is '0'. This enables a write current to flow to the selected memory cell transistor 11 only when the write data is '1'. This is because the memory cell transistor 11 is turned on when a potential of the word line 12 (control gate) is higher than a potential of the bit line 13 (drain) by the threshold, and a write current flows from the source line 14 to the bit line 13. Since a potential Vb0 of 5V (the same potential as the potential Vwb that is applied to the data line 16 when write data is '0') is applied to the non-selected bit lines 13 by way of the power supply line 18, a write current does not flow in the non-selected memory cell transistors 11.

When reading data from the memory cell transistor 11, a read potential Vrb (for example, 5V) is applied to the bit line 13 through the data line 16, and a read potential Vrs (for example, 0V) is applied to the source line 14. The change of potential of the bit line 13 generated when the word line 12 is selected is read by the sense amplifier through the data line 16.

In the write operation of the split gate type memory cell transistor 11, it is necessary to set high a potential difference between the source and drain to accelerate the hot electrons generated in the drain of the memory cell transistor 11 to the source. Accordingly, for example, the potential Vwb of 0V is applied to the bit line 13, and the write potential Vws that is 10V or higher (for example, 14V) to the source line 14.

As mentioned above, since 0V is applied to the data line 16 when write data is '1', a write current flows in the selected memory cell transistor 11. In this case, the potential of the source line 14 decreases and no excessive electric field is applied to the non-selected memory cell transistor 11. When the write data is '0', 5V is applied to the data line 16, and a write current does not flow in the selected memory cell transistor 11. In this case, the potential of the source line 14 does not decrease and the write potential Vws may affect all of the memory cell transistors 11. That is, when the word line 12 is selected under this circumstance, a write current flows in the non-selected memory cell transistors 11. Especially, when continuously writing data in the memory cell transistors 11 in the same row, the write current repeatedly flows in each memory cell transistor 11 in the same row, thus causing a write error.

Figure 2:
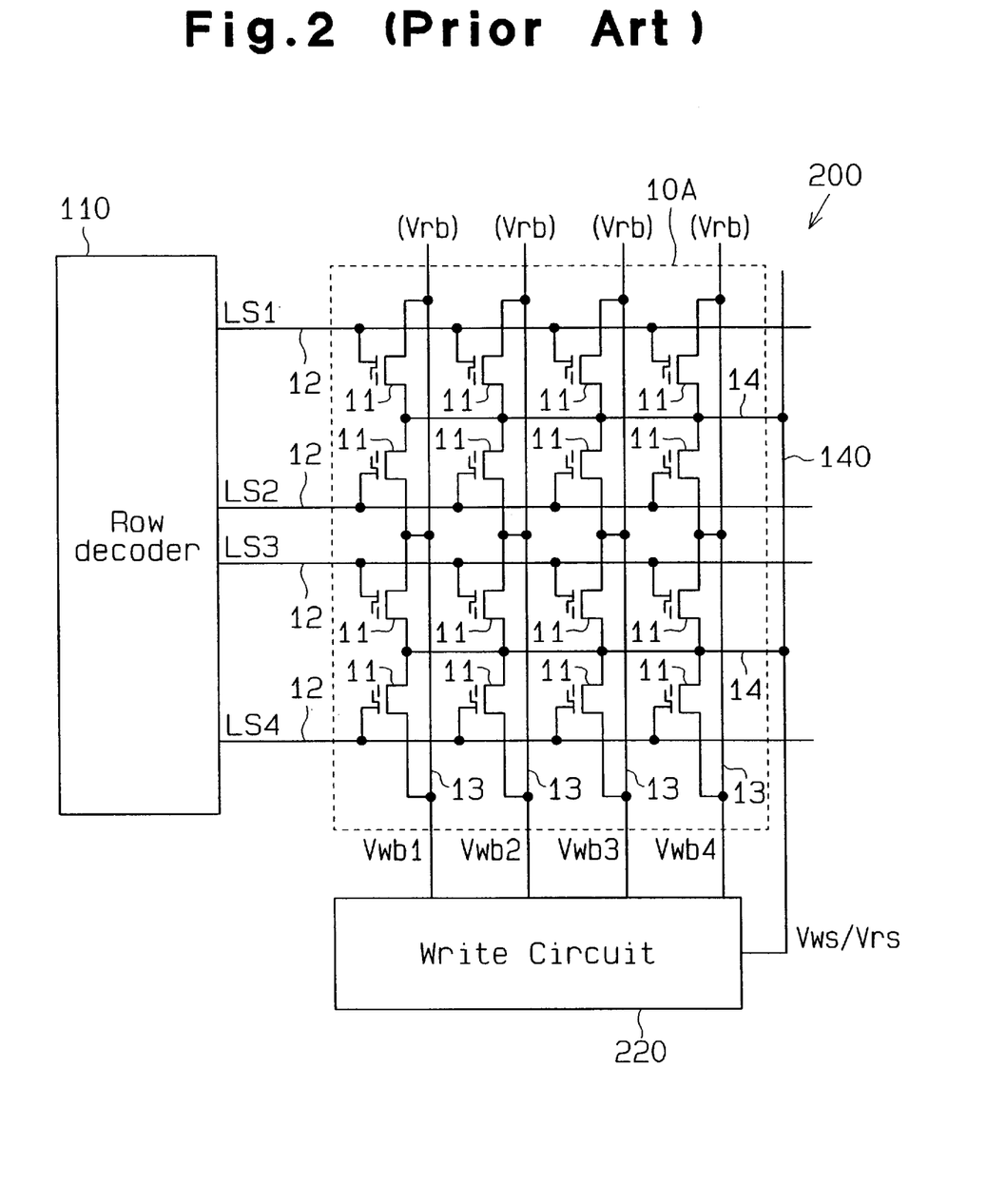
FIG. 2 is a schematic block diagram of a second conventional nonvolatile semiconductor memory device.

FIG. 2 is a schematic circuit diagram of a nonvolatile semiconductor memory device 200 including a memory cell block 10A. The memory cell block 10A is similar to the cell block 10 (FIG. 1), but does not include the first and second selection transistors 15, 17. Each bit line 13 is connected to a write circuit 220. When writing, the write circuit 220 supplies potentials Vwb1 to Vwb4 corresponding to a write data to the memory cell transistors 11 in each row through each bit line 13, respectively. The bit line 13 is also connected to a sense amplifier (not shown). When reading, the sense amplifier receives a potential VBL through each bit line 13. The potential VBL is generated by supplying a read potential Vrb to each memory cell transistor 11.

In the nonvolatile memory device 200, for example, when data '1' is written in the memory cell transistors 11 in all of the columns, all of the potentials Vwb1 to Vwb4 are set to 0V. Then, a write current flows in the memory cell transistors 11 in all of the columns, and the potential Vws of the source line 14 decreases by the amount of all of the write currents. The decrease of the source potential destabilizes the potential of the source line 14. The fluctuation of the write potential Vws varies write operation and causes a write error as a result.

The present invention provides a nonvolatile semiconductor memory device capable of performing a stable data writing operation.

SUMMARY OF THE INVENTION

In one aspect of the present invention, a nonvolatile semiconductor memory device includes a plurality of memory cell transistors arranged in a matrix of rows and columns. Each memory cell transistor has a floating gate and varies its threshold in accordance with an amount of charge accumulated in the floating gate. The memory device further includes a plurality of dummy cell transistors arranged along the memory cell transistors in a column direction. A selection circuit is connected to the memory cell transistors and the dummy cell transistors and selects one of the memory cell transistors and one of the dummy cell transistors. A write circuit is connected to memory cell transistors and applies a first potential corresponding to a write data to the selected memory cell transistor and applies a second potential corresponding to an inverted data of the write data to the selected dummy cell transistor.

In another aspect of the invention, a nonvolatile semiconductor memory device includes a plurality of memory cell transistors arranged in a matrix of rows and columns. Each memory cell transistor have a floating gate and varies its threshold according to an amount of charge accumulated in the floating gate. The memory device further includes a plurality of dummy cell transistors located next to the memory cell transistors in a column direction. A decoder circuit is connected to the memory cell transistors and the dummy cell transistors and selects memory cell transistors in one row and dummy cell transistors in one row. A write circuit is connected to the memory cell transistors and applies one of a first potential and a second potential to the memory cell transistors in a selected row in accordance with write data. A current restriction circuit is connected to the dummy cell transistors and restricts a current flowing in the dummy cell transistors in a selected line according to the write data in a step-like manner.

In another aspect of the present invention, a nonvolatile semiconductor memory device includes a matrix of memory cells including a plurality or rows and columns of memory cell transistors. A column of dummy cell transistors is located adjacent to the matrix of memory cells. A row decoder selects a row of the memory cell transistors. The row decoder generates a plurality of row select signals corresponding to the number of matrix rows. Each row select signal is provided to one row of the memory cell transistors and a corresponding one of the dummy cell transistors. A column decoder selectes a column of the memory cell transistors. The column decoder generates a plurality of column select signals corresponding to the number of matrix columns. Each column select signal is provided to one column of the memory cell transistors. A plurality of source lines connect rows or columns of the memory cell transistors and the dummy cell transistors. A write circuit generats a write potential. The write circuit includes a common source line connected to each of the plurality of source lines and provides the write potential to each of memory cell transistors and the dummy cell transistors. A data line connected to each of the columns of memory cell transistors and to the column of dummy cell transistors. The write circut provides a write data signal to each of the memory cell transistors and to the dummy cell transistors via the data line. An inverter is connected to the data line and generates an inverted write data signal. The inverted write data signal is provided to the column of dummy cell transistors.

In another aspect of the present inventoin, a nonvolatile semiconductor memory device includes a matrix of memory cells including a plurality or rows and columns of memory cell transistors. A column of dummy cell transistors is located adjacent to the matrix of memory cells. A row decoder selects a row of the memory cell transistors. The row decoder generates a plurality of row select signals corresponding to the number of matrix rows. Each row select signal is provided to one row of the memory cell transistors and a corresponding one of the dummy cell transistors. A column decoder selects a column of the memory cell transistors. The column decoder generates a plurality of column select signals corresponding to the number of matrix columns. Each column select signal is provided to one column of the memory cell transistors. A plurality of source lines connects rows or columns of the memory cell transistors and the dummy cell transistors. A write circuit generates a write potential. The write circuit includes a common source line connected to each of the plurality of source lines and provides the write potential to each of memory cell transistors and the dummy cell transistors. A current control circuit varies a current flowing in the selected dummy cell transistor. The current control circuit includes a plurality of current control transistors corresponding to the number of matrix columns. Each current control transistor is connected between the write circuit and the dummy cell transistors.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with accompanying drawings in which.

DETAILED DESCRIPTION OF THE PREFERRED EMBODIMENTS

Figure 3:
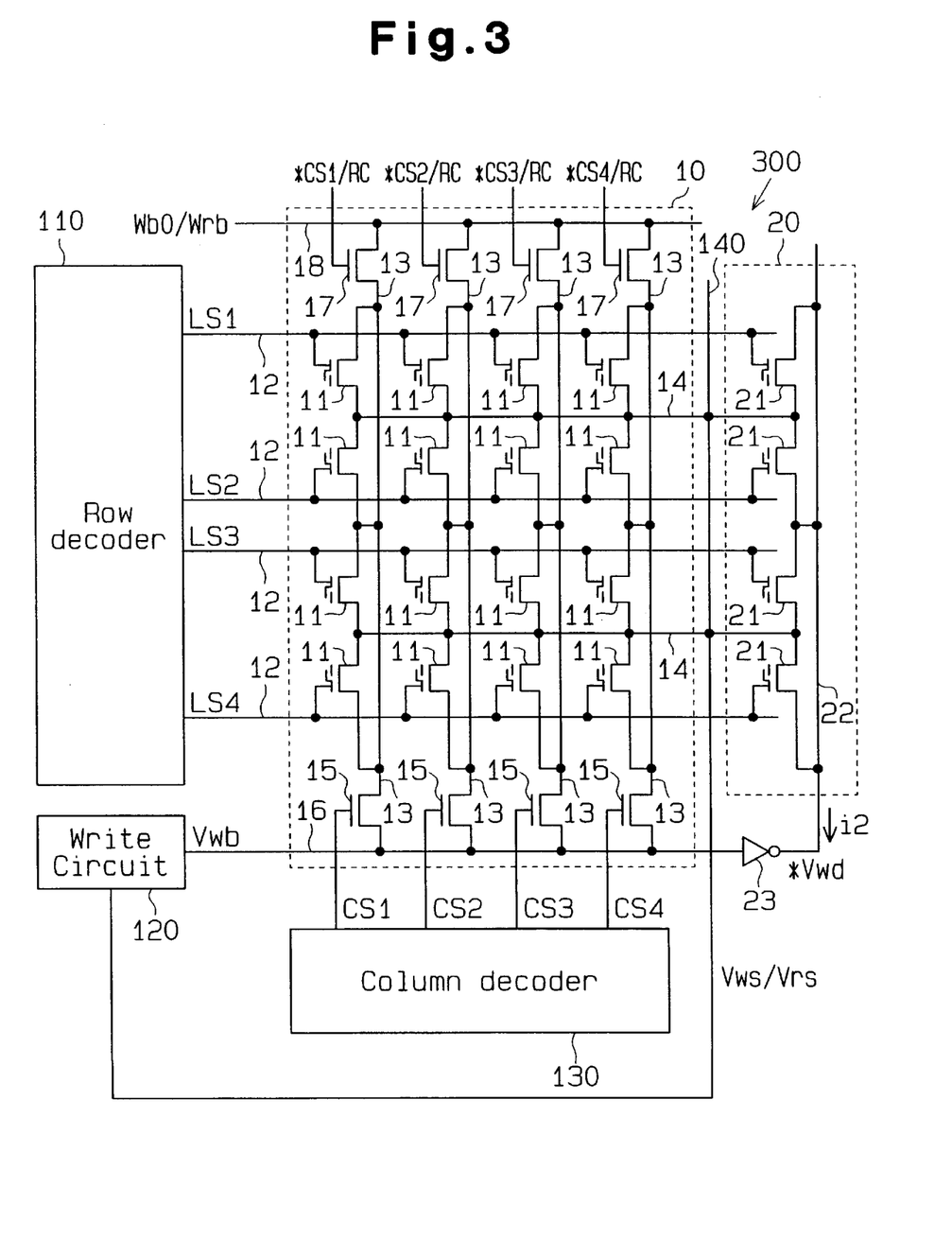
FIG. 3 is a schematic block diagram of a nonvolatile semiconductor memory device according to a first embodiment of the present invention.

FIG. 3 is a schematic diagram of a nonvolatile semiconductor memory device 300 according to a first embodiment of the present invention.

A memory cell block 10 includes memory cell transistors 11, word lines 12, bit lines 13, source lines 14, first and second selection transistors 15, 17, and a power supply line 18. Preferably the memory cell block 10 has the same construction as the memory cell block 10 in FIG. 1.

A dummy cell block 20 is located adjacent to the memory cell block 10. The dummy cell block 20 includes a plurality of dummy cell transistors 21. Inverted data generated by inverting the data written in a selected memory cell transistor 11 is written in a corresponding dummy cell transistor 21. In the write operation of data '1', the write current flows in the selected memory cell transistor 11 but does not flow in the dummy cell transistor 21. In the write operation of data '0', the write current does not flow in the selected memory cell transistor 11 but flows in the dummy cell transistor 21. Accordingly, the current supply source continuously supplies a constant write current regardless of the content of the data, thus achieving a stable write operation.

More specifically, the dummy cell block 20 includes the dummy cell transistors 21 and a dummy bit line 22. The dummy cell transistors 21 preferably have the same construction as the memory cell transistors 11 and each of the dummy cell transistors is arranged with respect to the transistors 11 in each row. That is, the dummy cell transistors 21 and the memory cell transistors 11 are manufactured with the same steps and are the same size. The dummy bit line 22 is aligned with the dummy cell transistors 21 and is commonly connected to the drain of each dummy cell transistor 21. The dummy bit line 22 is also connected to a data line 16 through an inverter 23. Accordingly, a write potential Vwb applied to the data line 16 is inverted by the inverter 23, and the inverted potential *Vwb is applied to the dummy bit line 22.

Each word line 12 of the memory cell block 10 extends into the dummy cell block 20 and is connected to the control gate of the dummy cell transistor 21 corresponding to the memory cell transistors 11 in the same row. Furthermore, each source line 14 extends into the dummy cell block 20 and is commonly connected to the source of an adjacent dummy cell transistor 21. This enables a simultaneous selection of the memory cell transistors 11 and the dummy cell transistor 21 in the same row. The potential common to each memory cell transistor 11 is applied to the source of the dummy cell transistor 21 through the source line 14. Further, the inverted potential *Vwb is applied to the drain of the dummy cell transistors 21 through the dummy bit line 12.

When a row decoder 110 supplies row selection signals LS1 to LS4 to each word line 12, the memory cell transistors 11 in a specific row and the corresponding dummy cell transistor are selectively activated. For example, if the memory cell transistors 11 and a dummy cell transistor 21 in the second row are selected, the row decoder 110 outputs the row selection signal LS2 of 2V and the row selection signal LS1, LS3, and LS4 of 0V. This activates the memory cell transistors 11 and the control gate of the dummy cell transistor 21 in the second row.

The first selection transistor 15 activates one of the bit lines 13 in response to the column selection signals CS1 to CS4. For example, when the memory cell transistors 11 in the second column are selected, only the column selection signal CS2 is raised, and the selection transistor 15 connected to the bit line 13 in the second column is selectively turned on. As a result, the bit line 13 in the second column is selectively connected to the data line 16, and the potential Vwb of the data line 16 is applied to the drain of each memory cell transistors 11 in the second column by way of the bit line 13 in the second column.

In the write operation of data '1', when a write circuit 120 applies the potential Vwb (for example, 0V), which is lower than the control gate potential (for example, 2V) by more than the threshold, to the selected bit line 13 by way of the data line 16, a selected memory cell transistor 11 is turned on. Then, the write current flows from the source line 14 to the bit line 13 through the selected memory cell transistor 11. In this case, since the inverted potential *Vwb (for example 5V), which is higher than the control gate potential, is applied to the dummy bit line 22 by the inverter 23, a selected dummy cell transistor 21 is turned on and the write current does not flow in the dummy transistor 21.

In the write operation of data '0', when the write circuit 120 applies the potential Vwb (for example, 5V), which is higher than the control gate potential, to the selected bit line 13 by way of the data line 16, a selected memory cell transistor 11 is not turned on and the write current does not flow in the selected memory cell transistor 11. Further, the potential Wb0 of 5V is applied to the non-selected bit line 13 through the power supply line 18, and the write current does not flow in the non-selected memory cell transistor 11. In this case, since the inverter 23 applies the inverted potential *Vwb (for example, 0V), which is lower than the control gate potential by more than the threshold, to the dummy bit line 22, a selected dummy cell transistor 21 is turned on and the write current flows from the source line 22 to the dummy bit line 22 through the dummy cell transistor 21. Accordingly, the write current is prevented from flowing in the non-selected memory cell transistor 11. Since the memory cell transistor 11 and the dummy cell transistor 21 have the same construction, the write current flowing in the memory cell transistor 11 and the write current flowing in the dummy cell transistor 21 are substantially equal. Accordingly, the sum (i1+i2) of the current i1 flowing from the source line 14 to the bit line 13 through the memory cell transistor 11 and the current i2 flowing from the source line 14 to the dummy bit line 22 through the dummy cell transistor 21 is substantially constant. Accordingly, regardless of the content of write data, the current flowing through the source line 14 is maintained substantially constant and the write current is prevented from flowing in the non-selected memory cell transistors 11.

Even when the threshold of the memory cell transistor 11 and the dummy cell transistor 21 changes by the injection of charge into the floating gate, the write current does not change drastically, but instead is kept substantially constant.

This is because the write current flowing in the memory cell transistor 11 and the dummy cell transistor 21 is controlled by a current control transistor (not shown) connected to the bit line 13 and the dummy bit line 22. Also, the sum (i1+i2) of the current i1 flowing in the memory cell transistor 11 and the current i2 flowing in the dummy cell transistor 21 is kept constant.

Figure 4:
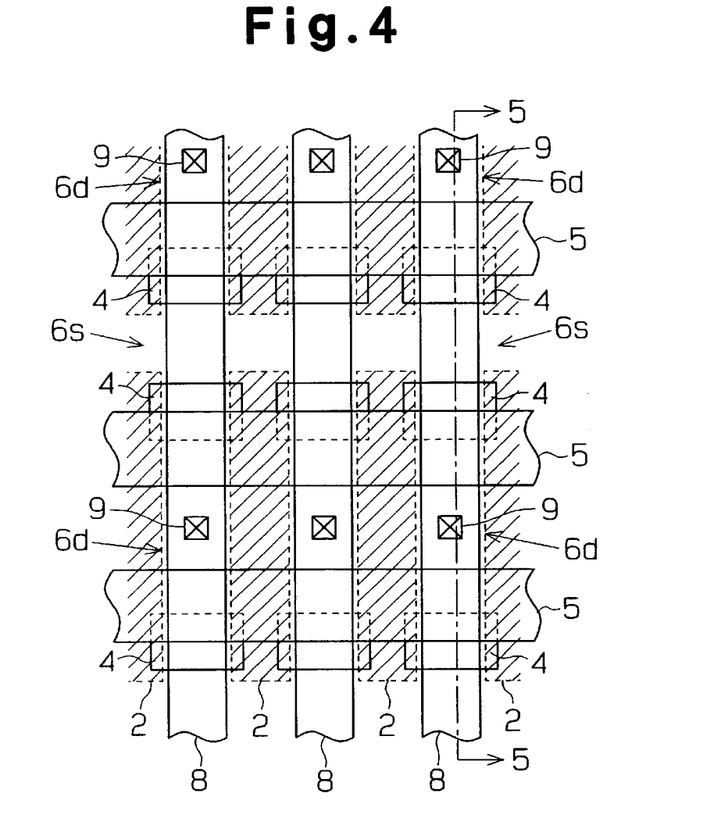
FIG. 4 is a schematic plan view of the memory cells of the nonvolatile semiconductor memory device of FIG. 3.
Figure 5:
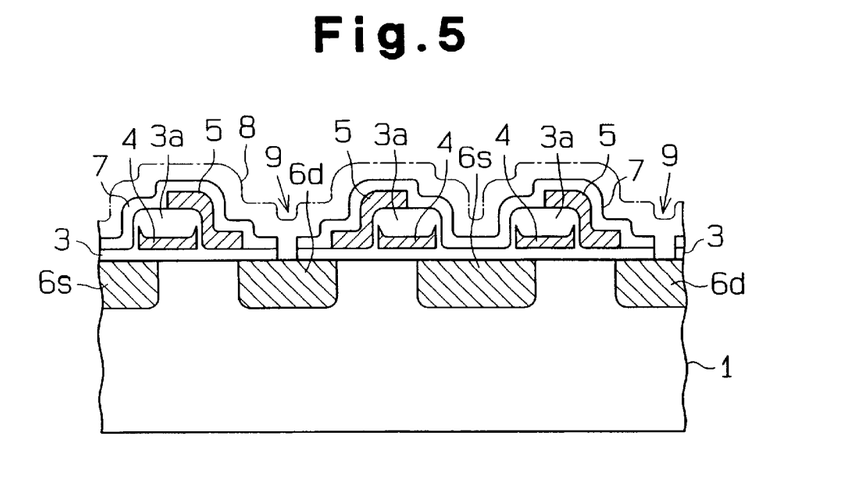
FIG. 5 is a sectional view taken on the line 5—5 of the memory cells of FIG. 4.

FIG. 4 is schematic plan view of a portion of the memory cell block 10A and the dummy cell block 20 of the non-volatile semiconductor memory device 300. FIG. 5 is a sectional view of a part of the memory cell block 10A and the dummy cell block 20 taken on the line 5—5 of FIG. 4. Referring now to FIGS. 4 and 5, the memory cell transistors 11 and the dummy cell transistors 21 each have a split gate structure that arranges a part of the control gate in parallel with the floating gate.

On a P type silicon substrate 1, strip-shaped dividing regions 2 and element regions are partitioned. The dividing region 2 is preferably made of relatively thick oxide film 3, such as LOCOS. The oxide film 3 is located on the substrate 1 and, on the oxide film 3, floating gates 4 are arranged spanning the adjacent dividing regions 2 over the plural cell block columns. Each floating gate 4 is independently arranged for one memory cell. The floating gate 4 includes a thick middle portion and an acute angular edge. An oxide film 3a is located on the floating gate 4. The edge of the floating gate 4 facilitates the generation of field concentration in the delete operation. Control gates 5, which cover a part of the floating gate 4 in each column, are arranged on the oxide film 3. The control gate 5 includes a first portion covering the floating gate 4 and a second portion located on the oxide film 3. The floating gate 4 and the control gate 5 in one column are arranged symmetrical to those in an adjacent row. An N-shaped first diffusion layer 6d is formed on the surface of the substrate region between the control gates 5 in adjacent columns, and a second diffusion layer 6s is formed on the surface of the substrate between the floating gates 4 in adjacent columns. The first diffusion layer 6d is independently provided in a position surrounded by the dividing regions 2 between the control gates 5 in adjacent columns. The second diffusion layer 6s extends along the control gates 5 between the floating gates 4 of adjacent columns. A memory cell transistor 11 is formed of the floating gate 4, the control gate 5, the first diffusion layer 6d and the second diffusion layer 6s. In this case, the first diffusion layer 6d is a drain and the second diffusion layer 6s is a source. A second oxide film 7 is located on the control gate 5, and an aluminum wiring 8 is arranged on the oxide film 7 in a direction crossing the control gate 5. The aluminum wiring 8 is connected to the first diffusion layer 6d through a contact hole 9.

In the double gate structure memory cell transistor 11, a resistance value during 'on' between the source and drain varies according to the charge amount injected in the floating gate 4. Accordingly, the 'on' resistance value of a specific memory cell transistor is varied according to the stored information, by injecting in the floating gate 4 the charge amount in accordance with the stored information.

Figure 6:
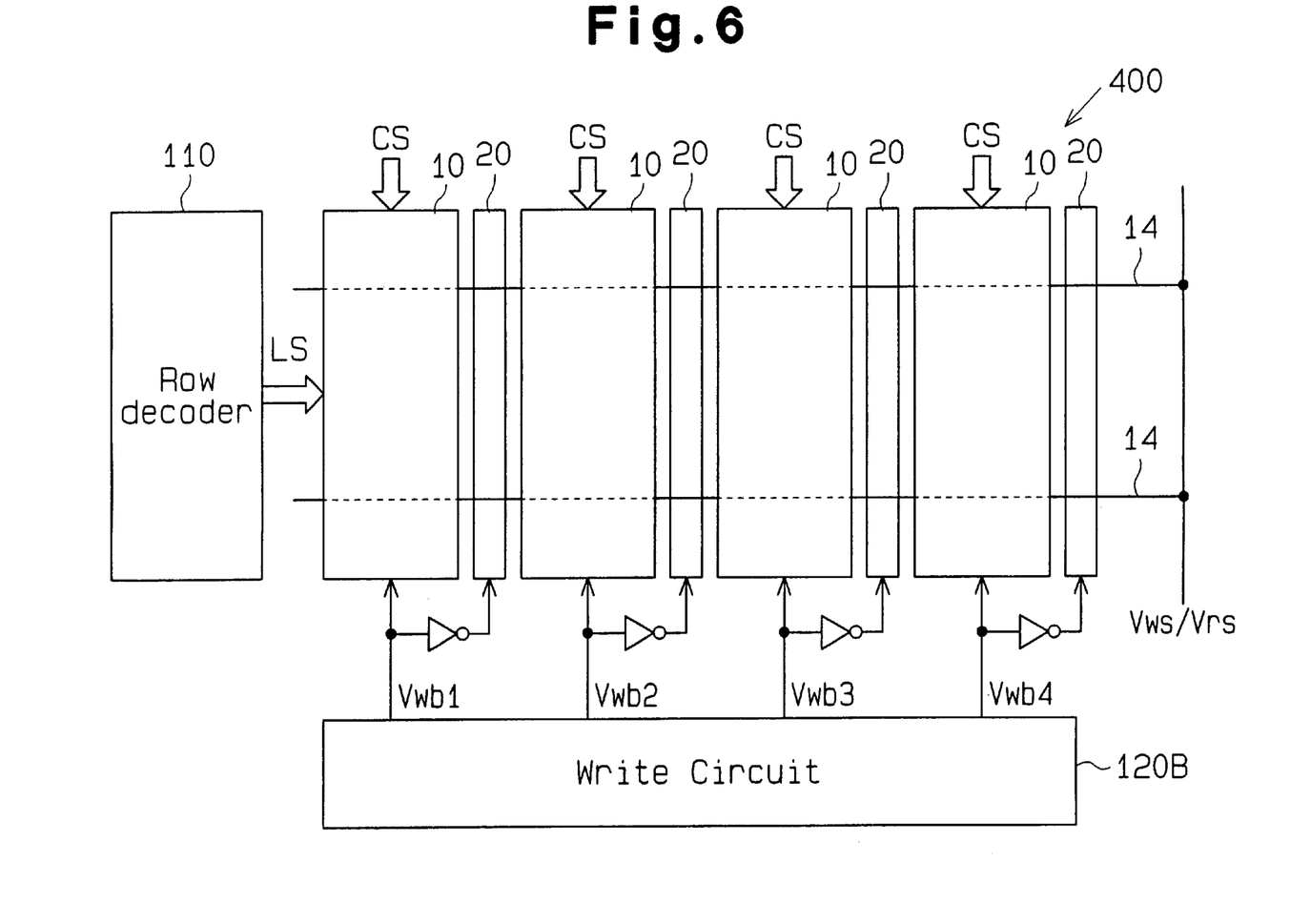
FIG. 6 is a schematic block diagram of a nonvolatile semiconductor memory device according to a second embodiment of the present invention.

FIG. 6 is a schematic block diagram of a nonvolatile semiconductor memory device 400 according to a second embodiment of the present invention. The nonvolatile semiconductor device 400 is capable of storing multi-value data, such as a four bit data.

Four memory cell blocks 10 are arranged in parallel. Word lines (not shown) and source lines 14 are shared by each memory cell block 10. A dummy cell block 20 is arranged adjacent to each memory cell block 10. The word lines and the source lines 14 are also shared by the dummy cell blocks 20. The memory cell blocks 10 and the dummy cell blocks 20 preferably have the same construction as described for the device 300 of FIG. 3.

A row decoder 110 applies a row selection signal LS (a signal of a number corresponding to the number of rows of the memory cell and dummy cell) to a word line shared by each memory cell block 10 and each dummy cell block 20. A selection transistor (not shown) is connected to a bit line (not shown) of each memory block 10 and a column selection signal CS (a signal of a number corresponding to the number of columns of the memory cell) is applied to the gate of the selection transistor. A write potential Vws/read potential Vrs is selectively applied to the source line 14 shared by each memory cell block 10 and each dummy cell block 20.

A write circuit 120B applies four potential values Vwb1 to Vwb4 corresponding to four bits of write data to the data line of the four memory cell blocks 10. For example, a potential of 0V (ground potential) is applied when the data is '1' and a potential of 5V (power supply potential) is applied when the data is '0'.

Since the dummy cell blocks 20 are arranged adjacent to each memory cell block 10, a constant current is supplied in the write operation of each memory cell block 10, regardless of the content of the data. Further, since the memory cell blocks 10 and the dummy cell blocks 20 are alternately connected by one source line 14, a sudden increase of the potential on the source line 14 is prevented, and a stable write potential that is equal in each memory cell block is obtained.

Two embodiments, which have the same construction of the dummy cell transistor and the memory cell transistor, have been explained. However, the memory cell transistor and the dummy cell transistor may have a different construction if a write current that flows in the bit line 13 and a write current that flows in the dummy bit line 20 are controlled to be substantially the same. In this case, the current capacity of the memory cell transistor 11 and the dummy cell transistor 21 is set to a value greater than the current capacity of a current control transistor connected to the bit line 13 and the dummy bit line 22.

Figure 7:
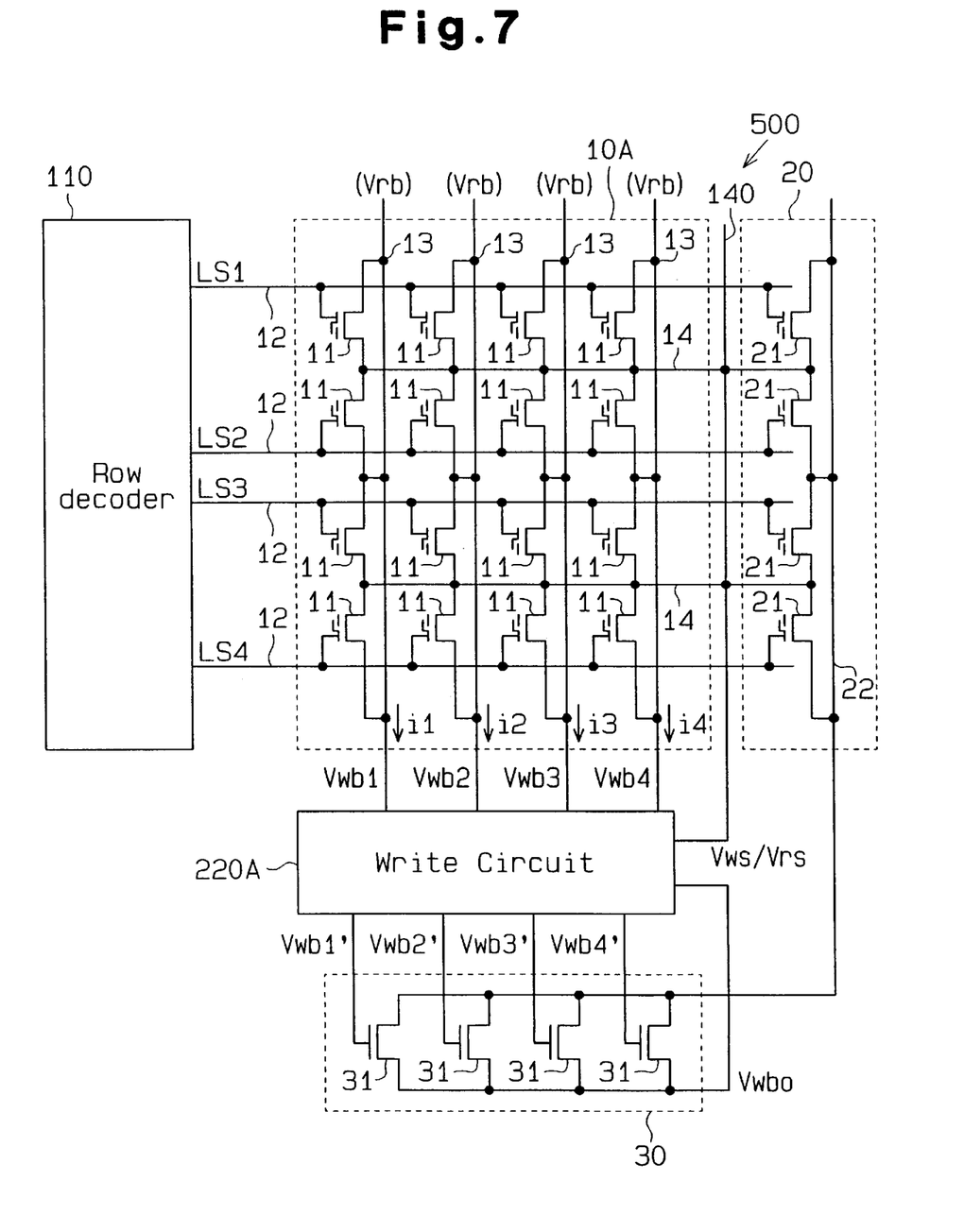
FIG. 7 is a schematic block diagram of a nonvolatile semiconductor memory device according to a third embodiment of the present invention.

FIG. 7 is a schematic block diagram of a nonvolatile semiconductor memory device 500 according to a third embodiment of the present invention. The third embodiment provides a current control circuit (a current restriction circuit) 30 for varying the current that flows in the dummy cell transistor 21 in the dummy cell block 20 in accordance with the content of the write data.

The current control circuit 30 includes a plurality of current control transistors 31. The number of the current control transistors 31 corresponds to the number of columns of the memory cell transistors 11. Each current control transistor 31 is arranged in parallel between the dummy bit line 22 and the write circuit 220A, and has a gate that receives respectively a potential Vwb1' to Vwb4' according to the write data from a write circuit 220A. To prevent influence from the write current that flows in the bit line 13 during a write operation, the write circuit 220A supplies potentials Vwb1' to Vwb4', which are independent from the potentials Vwb1 to Vwb4 applied to the bit line 13, to the current control transistors 31. However, the potentials Vwb1' to Vwb4' have the same values as those of the potentials Vwb1 to Vwb4.

The driving ability of the current control transistors 31 is preferably set such that substantially the same current as the write current in each bit line 13 flows in the transistor 31. For example, the write circuit 220A includes a transistor having the same driving ability as the current control transistor 31. A write current flows through the transistor.

In the write operation of data '0', when the write circuit 220A supplies potentials Vwb1 to Vwb4 higher than the potential of the control gate (for example, 5V) to each bit line 13, the selected memory cell transistor 11 in the same row is turned off. At the same time, when the write circuit 220A supplies potentials Vwb1' to Vwb4' higher than the potential of the control gate (for example, 5V) to the current control transistor 31, all of the transistors 31 are turned on. That is, the number of the memory cell transistors turned off in the write operation and the number of the current control transistors 31 are equal.

Further, when the write circuit 220A supplies a potential Vwb0 (for example, 0V) lower than the potential of the control gate (for example, 2V) by more than the threshold to the dummy bit line 22 through the transistor 31, the dummy cell transistor 21 is turned on. This makes the write current flow from the source line 14 to the dummy bit line 22. In this state, all four of the transistors 31 are turned on, and a large write current flows. That is, the write current that flows in the dummy bit line 22 is controlled to supplement the sum of the write current that flows in the dummy bit line 22 according to the write data and the write current that flows in each bit line 13. Accordingly, the sum (i0+i1+i2+i3+i4) of write currents i1 to i4 that flows in each bit line 13 and a write current i0 that flows in the dummy bit line 22 is kept substantially constant. Accordingly, a substantially constant power is supplied from the source line 14 regardless of the write data content, and as a result, the write potential Vws of the source line is stable.

Figure 8:
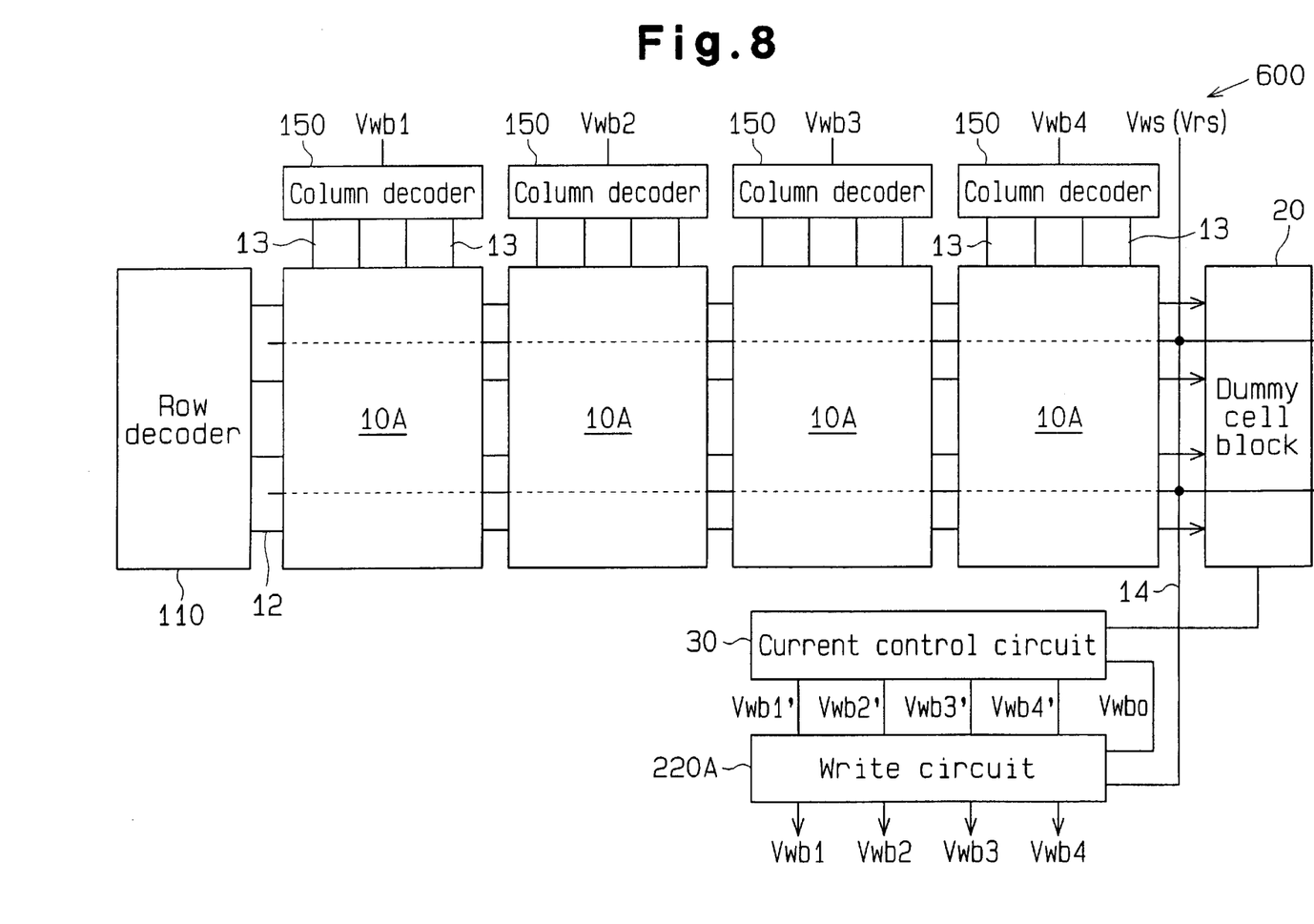
FIG. 8 is a schematic block diagram of a nonvolatile semiconductor memory device according to a fourth embodiment of the present embodiment.

FIG. 8 is a schematic block diagram of a nonvolatile semiconductor memory device 600 according to a fourth embodiment of the present invention. Its individual elements, including a memory cell block 10A, a row decoder 110, a dummy cell block 20, a current control circuit 30 and a write control circuit 220A preferably have the same construction as that in FIG. 7.

The nonvolatile semiconductor memory device 600 includes four memory cell blocks 10A arranged in parallel and a column decoder 150 connected to each memory cell block 10A. Each memory cell block 10A shares word lines 12 and source lines 14. One dummy cell block 20 is arranged in parallel with the four memory cell blocks 10. The dummy cell block 20 also shares the word lines 12 and the source lines 14 with the memory cell blocks 10A.

The row decoder 110 is connected to the word lines 12 and applies row selection signals (corresponding to the number of rows of the memory cell transistors and the dummy cell transistors) to the word lines 12. The column decoders 150 are connected to the bit lines 13 of each of the memory cell blocks 10A. The column decoders 150 receive potentials Vwb1 to Vwb4 from the write circuit 220A and selectively supply the potentials Vwb1 to Vwb4 to a bit line 13 in a specific column. The write circuit 220A applies a write potential Vws to the source line 14 in the write operation and applies a read potential Vrs to the source line 14 in a read operation. Because of this, in each memory cell block 10A, data is written in the memory cell transistor 11 related to a specific column designated by the column decoder 150 and a specific row designated by the row decoder 110. In this case, a potential (for example, 5V) higher than the potential of the word line 12 (for example, 2V) is applied to the bit line 13 in the non-selected columns in each memory cell block 10A, and the non-selected memory cell transistors 11 are turned off even if a potential Vws higher than 10V is applied from the source line 14. Accordingly, a write current does not flow in a non-selected memory transistor 11.

Even if all of the memory cell transistors 11 are non-selected in one memory cell block 10A, an increase of the write potential Vws is avoided by the current that flows in the dummy cell transistors of the dummy cell block 20. Accordingly, the nonselected memory cell transistor 11 is kept turned off in a stable manner. That is, since the write current does not flow in the nonselected memory cell transistor 11, write errors are prevented.

It should be apparent to those skilled in the art that the present invention may be embodied in many other specific forms without departing from the spirit or scope of the invention. Therefore, the present examples and embodiments are to be considered as illustrative and not restrictive and the invention is not to be limited to the details given herein, but may be modified within the scope and equivalence of the appended claims.

What is claimed is:

1. A nonvolatile semiconductor memory device, comprising:
   a plurality of memory cell transistors arranged in a matrix of rows and columns, each memory cell transistor having a floating gate and varying its threshold in accordance with an amount of charge accumulated in the floating gate;
   a plurality of dummy cell transistors arranged along said memory cell transistors in a column direction;
   a decoder circuit connected to said memory cell transistors and said dummy cell transistors for selecting one of said memory cell transistors and one of said dummy cell transistors; and
   a write circuit which applies a first potential corresponding to a write data to the selected memory cell transistor and applies a second potential corresponding to an inverted data of the write data to the selected dummy cell transistor.

2. The memory device of claim 1, wherein each memory cell transistor includes a control gate, a drain region and a source region, and said memory device further comprises:
   a plurality of word lines arranged along said memory cell transistors in each row and connected to the control gate of an associated memory cell transistor and to the control gate of an associated dummy cell transistor;
   a plurality of first bit lines arranged along said memory cell transistors in each column and connected to the drain region of an associated memory cell transistor;
   a plurality of second bit lines arranged along a column of said dummy cell transistors and connected to the drain region of said dummy cell transistor; and
   a source line commonly connected to the source regions of said memory cell transistors and said dummy cell transistors.

3. The memory device of claim 2, wherein each dummy cell transistor has substantially the same construction as each memory cell transistor.

4. A nonvolatile semiconductor memory device, comprising:
   a plurality of memory cell transistors arranged in a matrix of rows and columns, each memory cell transistor having a floating gate and varying its threshold according to an amount of charge accumulated in the floating gate;

a plurality of dummy cell transistors located next to said memory cell transistors in a column direction;

a decoder circuit connected to said memory cell transistors and said dummy cell transistors for selecting memory cell transistors in one row and dummy cell transistors in one row;

a write circuit connected to said memory cell transistors for applying one of a first potential and a second potential to said memory cell transistors in a selected row in accordance with write data; and a current restriction circuit connected to the dummy cell transistors for restricting a current flowing in the dummy cell transistors in a selected line according to the write data in a step-like manner.

5. The memory device of claim 4, wherein each memory cell transistor includes a control gate, a drain region and a source region, and said memory device further comprises:

a plurality of word lines arranged along said memory cell transistors in each row and connected to the control gate of an associated memory cell transistor and to the control gate of an associated dummy cell transistor;

a plurality of first bit lines arranged along said memory cell transistors in each column and connected to the drain region of an associated memory cell transistor;

a plurality of second bit lines arranged along the columns of said dummy cell transistors and connected to the drain region of said dummy cell transistor; and a source line commonly connected to the source regions of said memory cell transistors and said dummy cell transistors.

6. The memory device of claim 5, wherein each dummy cell transistor has substantially the same construction as each memory cell transistor.

7. A nonvolatile semiconductor memory device, comprising:

a matrix of memory cells including a plurality of rows and columns of memory cell transistors;

a column of dummy cell transistors located adjacent to the matrix of memory cells;

a row decoder for selecting a row of the memory cell transistors, the row decoder generating a plurality of row select signals corresponding to the number of matrix rows, each row select signal being provided to one row of the memory cell transistors and a corresponding one of the dummy cell transistors;

a column decoder for selecting a column of the memory cell transistors, the column decoder generating a plurality of column select signals corresponding to the number of matrix columns, each column select signal being provided to one column of the memory cell transistors;

a plurality of source lines connecting rows or columns of the memory cell transistors and the dummy cell transistors;

a write circuit for generating a write potential, wherein the write circuit includes a common source line connected to each of the plurality of source lines for providing the write potential to each of memory cell transistors and the dummy cell transistors; and a data line connected to each of the columns of memory cell transistors and to the column of dummy cell transistors, wherein the write circuit provides a write data signal to each of the memory cell transistors and to the dummy cell transistors via the data line; and an inverter connected to the data line for generating an inverted write data signal, wherein the inverted write data signal is provided to the column of dummy cell transistors.

8. The memory device of claim 7, wherein the dummy cells have substantially the same construction as the matrix of memory cells.

9. A nonvolatile semiconductor memory device, comprising:

a matrix of memory cells including a plurality or rows and columns of memory cell transistors;

a column of dummy cell transistors located adjacent to the matrix of memory cells;

a row decoder for selecting a row of the memory cell transistors, the row decoder generating a plurality of row select signals corresponding to the number of matrix rows, each row select signal being provided to one row of the memory cell transistors and a corresponding one of the dummy cell transistors;

a column decoder for selecting a column of the memory cell transistors, the column decoder generating a plurality of column select signals corresponding to the number of matrix columns, each column select signal being provided to one column of the memory cell transistors;

a plurality of source lines connecting rows or columns of the memory cell transistors and the dummy cell transistors;

a write circuit for generating a write potential, wherein the write circuit includes a common source line connected to each of the plurality of source lines for providing the write potential to each of memory cell transistors and the dummy cell transistors; and a current control circuit for varying a current flowing in the selected dummy cell transistor, the current control circuit including a plurality of current control transistors corresponding to the number of matrix columns, each current control transistor being connected between the write circuit and the dummy cell transistors.

10. The memory device of claim 9, wherein the dummy cells have substantially the same construction as the matrix of memory cells.

* * * * *